United States Patent [19]

McLeod

[11] Patent Number: 4,489,272
[45] Date of Patent: Dec. 18, 1984

[54] TEST CIRCUIT FOR TURN-ON AND TURN-OFF DELAY MEASUREMENTS

[75] Inventor: Mark H. McLeod, Poughkeepsie, N.Y.

[73] Assignee: International Business Machines Corporation, Armonk, N.Y.

[21] Appl. No.: 395,173

[22] Filed: Jul. 6, 1982

[51] Int. Cl.³ .................. G01R 17/02; G01R 29/02; G01R 31/28
[52] U.S. Cl. .................. 324/73 R; 331/46; 331/57; 331/DIG. 3; 340/653
[58] Field of Search ............ 324/57 R, 57 DE, 73 R, 324/73 AT; 340/653, 657, 658; 331/46, 49, 57, DIG. 3; 307/517; 328/129, 130, 162

[56] References Cited

U.S. PATENT DOCUMENTS 4,063,080 12/1977 Eichelberger .................. 235/302
4,392,105 7/1983 McLeod .................. 324/57 DE Primary Examiner—Gerard R. Strecker
Assistant Examiner—Walter E. Snow
Attorney, Agent, or Firm—James E. Murray

[57] ABSTRACT

A test circuit that is particularly suitable for inclusion on an LSI chip when testing a new technology or process. The circuit will enable accurate determination of the effects of loading on the turn-on and turn-off delays of one or more logic circuits on the chip. These determinations are based upon a comparison of the periods of different signals obtainable from the test circuit.

9 Claims, 8 Drawing Figures

TEST CIRCUIT FOR TURN-ON AND TURN-OFF DELAY MEASUREMENTS

INTRODUCTION

This invention relates to test sites which are often included on chips made by large scale integration (LSI) techniques when a new technology or a new process is being tested. More particularly, the invention relates to an improved circuit for performing delay measurements on an LSI chip, the improved circuit enabling one to separately measure the turn-on and turn-off delays of one or more circuits on the chip.

When changes are being considered in the manufacture of LSI chips, the changes and the new chips must be thoroughly tested. One way of testing involves production of sample chips with a variety of circuit structures on them. Some of the circuit structures will be test circuits that aid in testing the other structures. One parameter that can be of great significance in determining the value of a new manufacturing technique is the delay introduced by turning on and turning off various circuits on the chip. Since an LSI chip can have a very large number of sequential circuits on it, lengthy individual delays cannot be tolerated. Of course, the smaller the delay, the faster the circuits, and the faster will be the machine that uses the circuits.

U.S. Pat. No. 4,392,105 filed by M. H. McLeod Dec. 17, 1980 for Test Circuit For Delay Measurements on an LSI Chip, and assigned to International Business Machines Corporation, describes circuits for determining the turn-on and turn-off delays of circuits on a chip. The determinations involve separate measurement of the durations of the "up" and "down" portions of different oscillating signals. The differences in these measured durations are used to determine the desired delays. Although it can be used to accurately determine the turn-on and turn-off delays of circuits on LSI chips, the test circuit described in copending U.S. patent application Ser. No. 217,373 requires the use of measuring apparatus which can accurately measure the duration of the separate "up" and "down" portions of the periodic signals. Such measuring equipment is relatively delicate and expensive.

SUMMARY OF THE INVENTION

It is an object of this invention to provide an improved test circuit for use in determining turn-on and turn-off delays of circuits on an LSI chip.

A more particular object of the invention is to provide an improved circuit which enables determination of delays through the use of measurements which are readily obtainable with relatively inexpensive commonly available measuring devices.

In accordance with a preferred embodiment of the invention, three related oscillating loops are provided. The first loop is a reference loop which does not contain the circuit for which delays are to be determined. The other two loops both contain the circuit under test. One of them has a period which differs from the period of the reference loop by an amount which is determined by the turn-on delay of the circuit under test; the other loop has a period which differs from the period of the reference loop by an amount which is determined by the turn-off delay of the circuit under test. As a check on the accuracy of the turn-on and turn-off delay determinations, the preferred embodiment may also include a fourth loop having a period which differs from the period of the reference loop by an amount that is determined by the sum of the turn-on and turn-off delays of the circuits under test. In yet another preferred embodiment of the invention, either the second or third of the oscillating loops mentioned above will not be present. In this embodiment, the first and fourth loops will be used to determine the sum of the turn-on and turn-off delays of the circuit under test; the first and the second (or third) of the loops discussed above will be used to determine the turn-on (or turn-off) delay of the circuit under test; the turn-off (or turn-on) delay then being determined simply by subtracting one determination from the other.

The primary advantage of this invention is that its use will enable determination of the separate turn-on and turn-off delays of a circuit on an LSI chip, through the use of direct measurements that can be made by relatively inexpensive and readily available measuring devices. Also, these measurements are more easily automated than were those of the prior art.

BRIEF DESCRIPTION OF THE DRAWINGS

In the accompanying drawings, forming a material part of this disclosure.

DETAILED DESCRIPTION

For further comprehension of the invention, and of the objects and advantages thereof, reference is made to the following description and accompanying drawings, and to the appended claims in which the various novel features of the invention are more particularly set forth.

Figure 1:
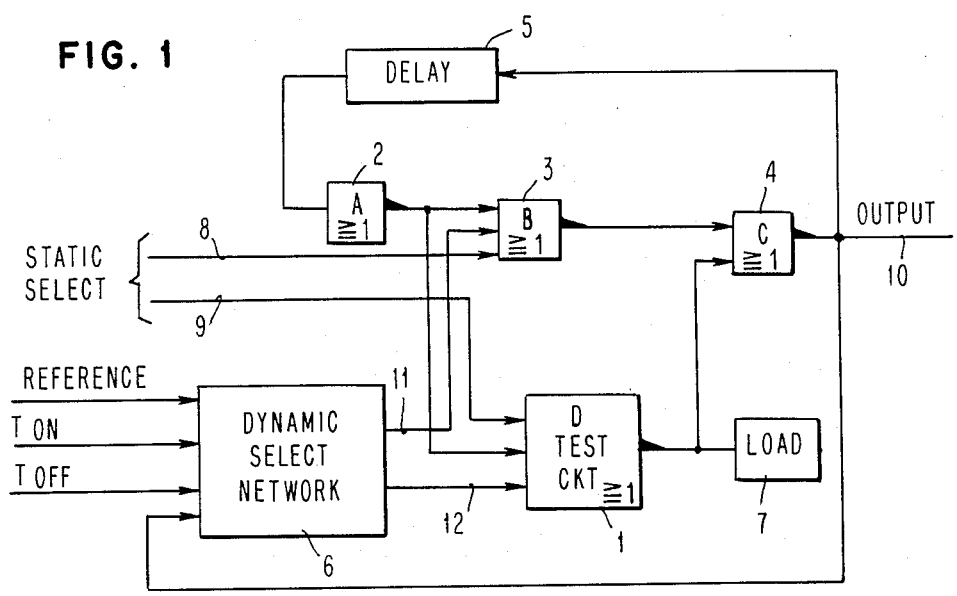
FIG. 1 is a generalized block diagram of a preferred embodiment of the test circuit.

Referring to FIG. 1, there is shown a schematic diagram of a preferred embodiment of this invention. In addition to the circuit 1 being tested the test circuitry comprises three NOR circuits 2, 3 and 4, a delay element 5 and a dynamic select network 6. In a typical implementation, this circuitry would be embodied within a chip that is used for testing new LSI circuits and/or methods of production. Not shown in FIG. 1 are receivers for signals coming in from off of the chip and drivers for signals that are to be sent off the chip (e.g., at the output of the circuit). As is well known to those skilled in the art, drivers and receivers are utilized to whatever extent is desirable, based on the particular circuitry involved. The circuit being tested 1 may have associated with it one or more loads 7.

Also shown in FIG. 1 are several control lines. The dynamic select network 6 has three main input control lines. In the preferred embodiment, each of them is responsive to a d.c. level. As will be explained further below: the REFERENCE line is brought up to enable the system to generate a reference signal; the $T_{on}$ line is brought up in order to cause the system to generate a periodic signal having a period which differs from that of the reference signal by an amount dependent upon the turn-on delay of the test circuit 1; and the $T_{off}$ line is brought up to cause the system to generate a periodic signal having a period which differs from that of the reference signal by an amount that is related to the turn-off delay of the test circuit 1. Static select lines 8 and 9 can be used to put the system into a mode in which a periodic signal will be generated which has a period differing from that of the reference signal by an amount that is dependent upon the sum of the turn-on and turn-off delays of the circuit 1 being tested. The periodic signals generated by this test system are sensed at the output 10.

Figure 2:
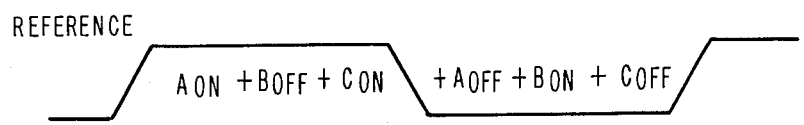
FIG. 2 is a timing diagram showing the signal produced by oscillations in a reference loop of the circuit.

Operation of the system for measurement of turn-on and turn-off delays proceeds as follows. (In FIG. 1, the NOR circuits 2, 3 and 4, and the circuit being tested 1 have been labeled A,B,C and D, respectively, in order to simplify the following description.) First, the REFERENCE input to the dynamic select network 6 is raised in order to set the system shown in FIG. 1 into a mode in which a signal will propagate through the loop formed by circuits A, B and C to form the signal shown in FIG. 2. (As will be discussed below, the delay 5 is inserted into the circuit in order to furnish sufficient time for the dynamic select network 6 to perform its control function. Because the delay 5 will affect all signals generated by this circuitry in exactly the same manner, and because it is the differences between periods of the various signals generated by this circuitry that are significant, the effects of the delay upon the output signal may be ignored.) As is shown in FIG. 2, the total period of this reference signal is equal to the sum of the turn-on delay of circuit A, the turn-off delay of circuit B, the turn-on delay of circuit C, the turn-off delay of circuit A, the turn-on delay of circuit D and the turn-off delay of circuit C.

Figure 3:
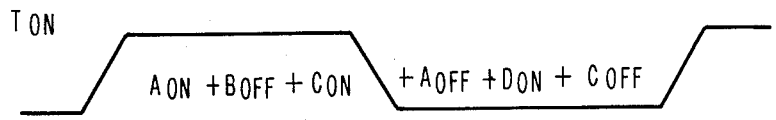
FIGS. 3, 4 and 5 are timing diagrams showing signals produced by oscillations in loops which have periods that differ from the reference period by amounts that are dependent upon, respectively, the turn-on delay, the turn-off delay, and the sum of the turn-on and turn-off delays of the circuit under test.

In order to take measurements which are related to the turn-on delay of the circuit D being tested, input line $T_{on}$ to the dynamic select network 6 is raised. The dynamic select network 6 is so designed that, via its control lines 11 and 12 which go to circuits 3 and 1 respectively, the output of circuit 2 will be directed to circuit 3 after circuit 2 has been turned on, and the output of circuit 2 will be directed to circuit 1 after circuit 2 has been turned off. This will result in the generation of the signal shown in FIG. 3 which has a total period that is the sum of the turn-on delay of circuit 2 (A), the turn-off delay of circuit 3 (B), the turn-on delay of circuit 4 (C), the turn-off delay of circuit 2 (A), the turn-on delay of circuit 1 (D) and the turn-off delay of circuit 4 (C). The significant point is that the difference between the period of the signal shown in FIG. 3 and the period of the reference signal shown in FIG. 2 is equal to the difference between the turn-on delays of the circuit being tested 1 (D) and circuit 3 (B). As the load 7 is varied, the variance of the delay of circuit 1 (D) as a function of loading can be measured. Thus, the effects of loading on the turn-on delay of circuit 1 (D) can readily be determined merely by measuring the difference between the periods of the reference signal shown in FIG. 2 and the $T_{on}$ signal shown in FIG. 3. The difference between the periods of these two signals will be equal to the difference between the turn-on delays of circuit 3 (B) and 1 (D).

Figure 4:
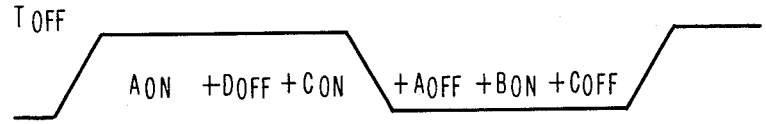

In order to take measurements which are related to the turn-off delay of the circuit D being tested, input line $T_{off}$ to the dynamic select network 6 is raised. The dynamic select network 6 is so designed that, via its control lines 11 and 12 which go to circuits 3 and 1 respectively, the output of circuit 2 will be directed to circuit 3 after circuit 2 has been turned off, and the output of circuit 2 will be directed to circuit 1 after circuit 2 has been turned on. This will result in the generation of the signal shown in FIG. 4 which has a total period that is the sum of the turn-on delay of circuit 2 (A), the turn-off delay of circuit 1 (D), the turn-on delay of circuit 4 (C), the turn-off delay of circuit 2 (A), the turn-on delay of circuit 3 (B) and the turn-off delay of circuit 4 (C). The significant point is that the difference between the period of the signal shown in FIG. 4 and the period of the reference signal shown in FIG. 2 is equal to the difference between the turn-off delays of the circuits being tested 1 (D) and circuit 3 (B). This difference will vary as the load 7 is varied. Thus, effects of loading on the turn-off delay of circuit 1 (B) can readily be determined merely by measuring the difference between the periods of the reference signal shown in FIG. 2 and the signal shown in FIG. 4. The difference between the periods of these two signals will be equal to the difference between the turn-off delays of circuit 3 (B) and 1 (D).

Figure 5:
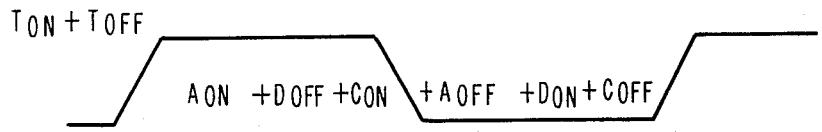

In order to take measurements which are related to the sum of the turn-on and turn-off delays of the circuit 1 (D) being tested, static control lines 8 and 9 are used to condition the circuit so that circuit 3 (B) is disabled and circuit 1 (D) is enabled. Then, the oscillating signal will be produced by a loop composed of circuits 1, 4 and 2 (D, C and A). The period of this signal will be the sum of the delays introduced by the turn-on of circuit 2 (A), the turn-off delay of circuit 1 (D), the turn-on delay of circuit 4 (C), the turn-off delay of circuit 2 (A), the turn-on delay of circuit 1 (D) and the turn-off delay of circuit 4 (C). This signal, which is illustrated in FIG. 5, has a period which differs from the period of the REFERENCE signal of FIG. 2 by an amount that is equal to the difference between the sum of the turn-on and turn-off delays of circuit 1 (D) and the sum of the turn-on and turn-off delays of circuit 3 (D). This difference will vary as the load 7 is varied. Thus, the effect of loading on the sum of the turn-on and turn-off delays of circuit 1 (D) can readily be determined merely by measuring the difference between the periods of the signals shown in FIGS. 2 and 5.

Figure 6:
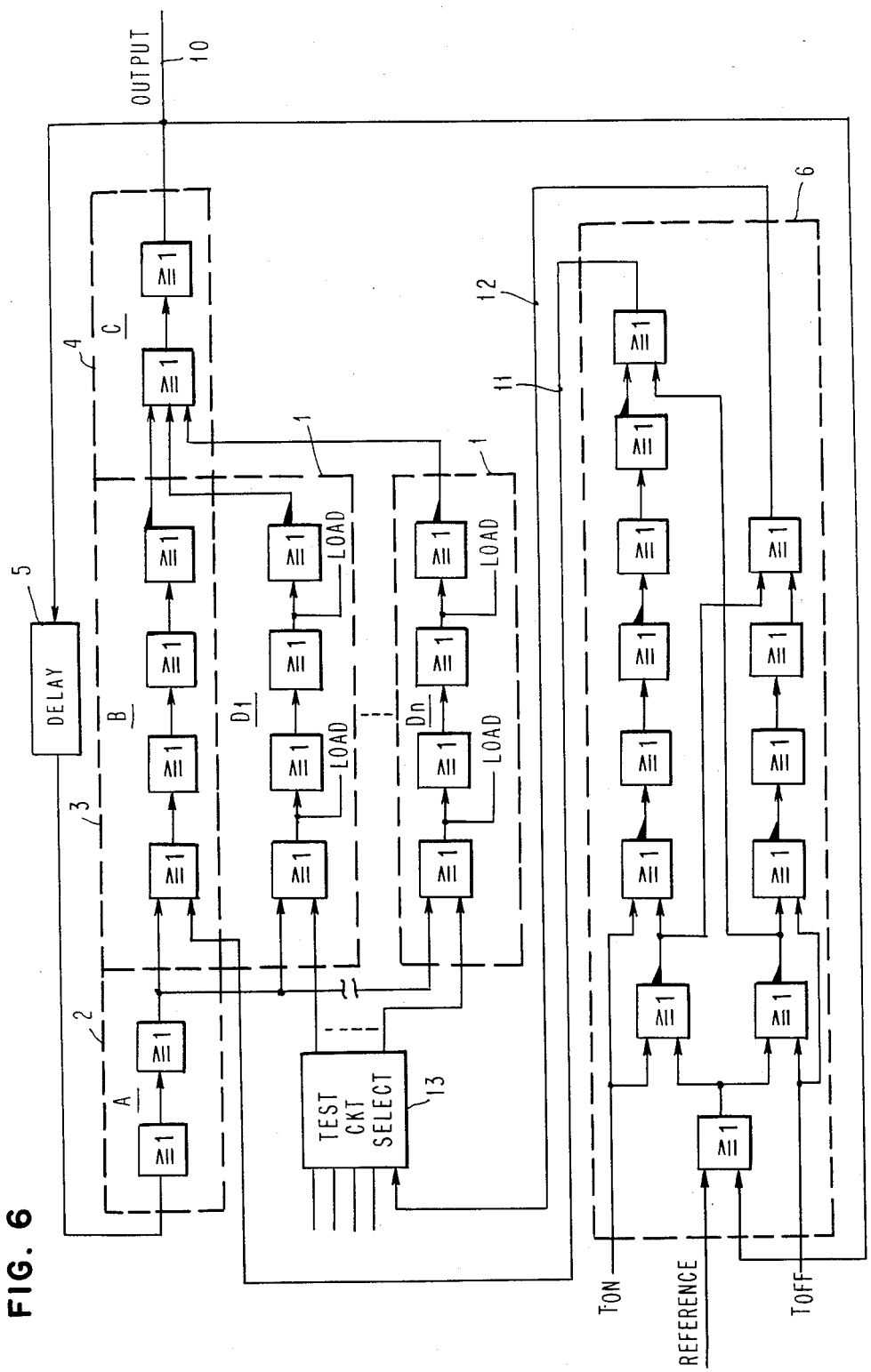
FIG. 6 shows an implementation of the invention using OR/NOR circuitry, and showing additional details of a dynamic select network.

Referring now to FIG. 6, additional details are shown of a particular implementation of the invention using OR/NOR circuitry. In FIG. 6, the reference numerals 1 through 12 and the alphabetic designations A, B, C and D indicate portions of the circuit that are functionally the same as corresponding reference numerals and letters shown in FIG. 1. Thus, FIG. 6 shows, for example, that the dynamic select network 6 of FIG. 1 can be implemented using six OR blocks and six NOR blocks. The specific implementation shown in FIG. 6 also illustrates the point that each of the circuits 1, 2, 3 and 4 (D, A, B and C, respectively) will typically utilize a plurality of individual circuits in their implementation. As is also shown in FIG. 6, a specific implementation of this invention can utilize the test system for testing turn-on and turn-off delays of a plurality of circuits $D_1$ through $D_n$. In such a situation, a test circuit select mechanism 13 would need to be added to the system in order to select which circuit is to be tested. Specific details of implementing such a select mechanism are well known to those skilled in the art and need not be described herein. Also, in FIG. 6 it should be noted that each of the circuits to be tested 1 (D) is shown as having a plurality of loads. In general, any number of loads may be associated with any of the circuits being tested, and switching mechanisms for changing the loading of circuits being tested can be utilized if desired. Still another significant point illustrated by the specific embodiment of FIG. 6 is that circuits 2 and 4 (A and C) are shown here as being implemented in non-inverting logic. For this invention, the significant aspect of this is simply that, for the periodic signals, it is essential that there be an odd number of inversions during each "up" portion and each "down" portion of the periodic signal. This can be accomplished by having three consecutive inverting circuits as shown in FIG. 1, or only one inverting circuit in the loop as shown in FIG. 6. If the circuits being tested 1 (D) were made of noninverting circuitry, then it would be necessary that either circuit 2 (A) or circuit 4 (C), but not both, be an inverting circuit. From the specific implementation shown in FIG. 6, it will also be clear why the delay 5 is introduced into the circuitry. Its function simply is to insure that the dynamic select circuitry 6 has time to perform its function (twice during each complete period) before the output of circuit 4 (C) is fed back to circuit 2 (A). The precise amount of delay introduced by delay 5 is not important, so long as it is sufficient to ensure that dynamic select network 6 has enough time to perform its function.

Figure 7:
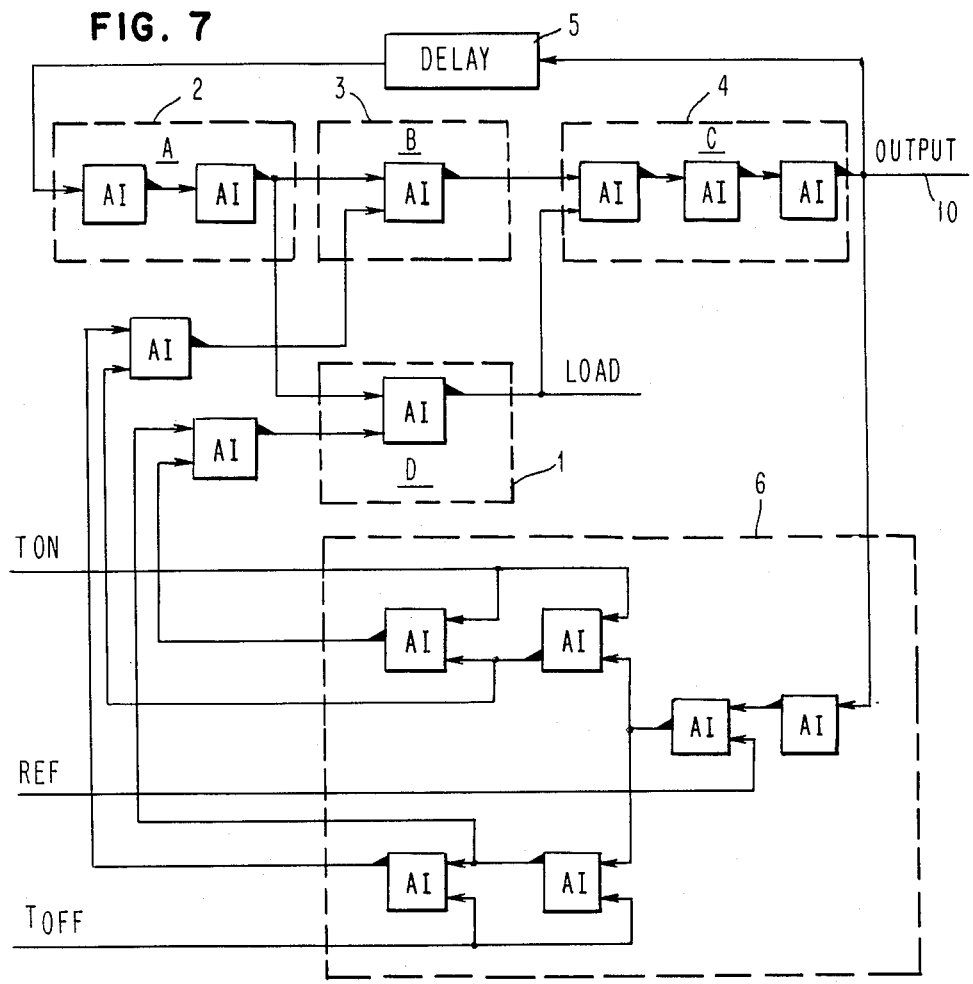
FIG. 7 shows additional details of an implementation using AND/NAND circuitry, and showing details of the dynamic select network.

Referring now to FIG. 7, there are shown details of an implementation using all AND-INVERT blocks. As before, circuit elements 1 through 6 and A, B, C and D correspond to similarly labeled elements in FIG. 1 and produce signals which are described in FIGS. 2 through 5.

Figure 8:
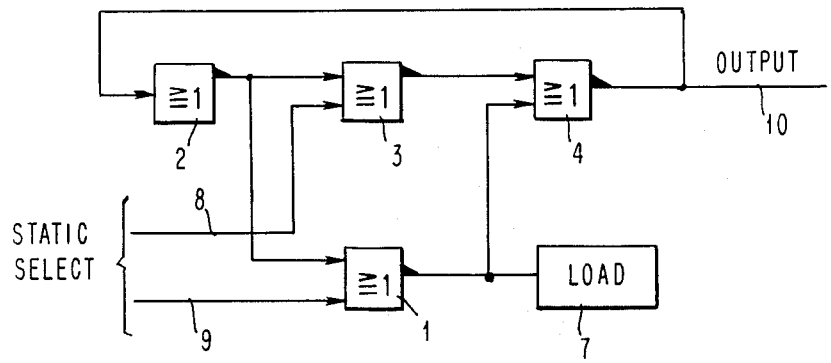
FIG. 8 shows an alternative embodiment of the invention which does not require a dynamic select network.

FIG. 8 shows yet another embodiment of the invention which does not require the dynamic select network 6 which has been shown and described in the previous figures. FIG. 8 is identical to FIG. 1 except that the dynamic select network has been eliminated, along with the delay network 5 which is not needed once the dynamic select network has been eliminated. The embodiment shown in FIG. 8, under control of static select lines 8 and 9, can be used to produce the output REFERENCE waveform shown in FIG. 2 and the $T_{on}$ plus $T_{off}$ waveform shown in FIG. 5. The latter is related to the REFERENCE waveform by an amount dependent upon the sum of the turn-on and turn-off delays of the circuit being tested. Assuming that the delays introduced by circuit 1 (D) are greater than delays introduced by circuit 3 (B) the circuit of FIG. 8 can produce the waveform shown in FIG. 3 without the use of a dynamic select network. In this mode, both of circuits 1 and 3 are selected so that both will respond to the outputs of circuit 2. When circuit 2 is turned "on", its output will turn both of circuits 1 and 3 "off". As soon as circuit 3 is turned off its output will rise (because, as shown in FIG. 8, this implementation is made of inverting logic) and, even though circuit 1 has not yet been turned off (because, as noted above, this implementation utilizes circuitry in which circuit 1 has a longer delay than circuit 3) circuit 4 will respond to this first transition and turn on. Then, when circuit 1 subsequently turns off and its output rises, circuit 4 will have already been turned on and will not be affected by the output of circuit 1. Then, on the next portion of the waveform, circuit 2 will be turned off and circuits 1 and 3 will respond by turning on. However, circuit 4 will not immediately respond to the turn-on of circuit 3 because circuit 1 will still be off, thus holding circuit 4 on. Circuit 4 will not turn off until both of circuits 1 and 3 have been turned on; thus circuit 4 is controlled in this portion of the cycle by the turn-on of circuit 1. Therefore, so long as circuit 1 has a greater delay than circuit 3, and so long as the delay introduced by circuit 1 is substantially less than the sum of the delays of circuits 2, 3 and 4, the implementation of FIG. 8 can be utilized to produce the waveform of FIG. 3 without the use of a dynamic select network. As will be recognized by those skilled in the art, other specific implementations which utilize other logic could produce a signal such as the one shown in FIG. 4 without the use of a dynamic select network. Since the implementation shown in FIG. 8 can produce the REFERENCE signal (FIG. 2) as well as the $T_{on}$ signal shown in FIG. 3 and the $T_{on}$ plus $T_{off}$ signal shown in FIG. 5, it can be used to produce signals from which calculations can be made of the turn-on delay of circuit 1 and the sum of the turn-on and turn-off delays of circuit 1. Of course, the difference between these latter two delays will be equal to the turn-off delay of circuit 1.

Although the implementation shown in FIG. 8 is less complex than the implementation shown in FIG. 1, the implementation shown in FIG. 1 does have advantages which in many applications will justify its increased complexity. Most particularly, the implementation shown in FIG. 1 enables separate individual determinations of turn-on and turn-off delays, in addition to a separate determination of the sum of the turn-on and turn-off delays. Since the turn-on delay and the turn-off delay and the sum of them is each separately determined, this furnishes a check on the accuracy of the system. The sum of the first two determinations should be equal to the third determination. In the embodiment shown in FIG. 8, this check cannot be accomplished.

The system described above will not generally provide a direct measure of the turn-on and turn-off delays of the circuit under test unless the turn-on and turn-off delays of another circuit (circuit B in the implementations described above) are known. This system does yield an accurate measure of the manner in which varying loads affect the delays. However, direct measures of total delays can be obtained for non-inverting circuitry using this system. If the above, or equivalent, implementations utilize identical circuits for circuits B and D, and add to one of them a non-inverting circuit to be tested, the resulting signals will have periods differing by an amount which determines the turn-on and turn-off delays of the circuit being tested.

As will be recognized from the above descriptions, this invention has certain essential elements. The first element is the establishment of a reference period which does not include delays introduced by the circuit being tested. Then, at least two other periods must be established: one of them affected by either the turn-on or the turn-off delay of the circuit being tested; and the other affected either by the turn-off (or turn-on) or by the sum of the turn-on and turn-off delays of the circuit being tested. In one preferred embodiment, signals having periods illustrating all four of the above criteria are generated.

Although the invention has been illustrated above using OR, NOR and NAND circuits, it is not limited to any particular circuit type.

While we have illustrated and described preferred embodiments of the invention, it is to be understood that we do not limit ourselves to the constructions herein disclosed and the right is reserved to all changes and modifications coming within the scope of the invention as defined in the appended claims.

Having thus described my invention, what I claim as new, and desire to secure by Letters Patent is:

1. For use on an LSI chip, a system for measuring the turn-on and turn-off delays of a loaded logic circuit on said chip, said system comprising:
   a first loop not including said logic circuit for producing a first periodic reference signal;
   a second loop including said logic circuit for producing a second periodic signal, said second periodic signal being related to said reference signal in a manner that is dependent upon the turn-on delay of said logic circuit;
   a third loop including said logic circuit and producing a third periodic signal, said third periodic signal being related to said reference signal in a manner that is dependent upon the turn-off delay of said logic circuit; and
   means for causing mutually exclusive production by said loops of each of said periodic signals.

2. The measuring system of claim 1 further including:
   a fourth loop including said logic circuit for generating a fourth periodic signal, said fourth periodic signal being related to said reference signal in a manner that is dependent upon the sum of the turn-on and turn-off delays of said logic circuit.

3. The measuring system of claim 1 further including:
   dynamic selection means for dynamically selecting the individual circuits which make up each of said second and third loops during the time that said loop is producing its respective second or third periodic signal.

4. The measuring system of claim 1 further including:
   a plurality of electrical loads associated with said logic circuit; and
   means for selecting one or more of said plurality of loads for electrical attachment to said logic circuit.

5. The measuring system of claim 1 further including:
   at least one additional loaded logic circuit to be measured; and
   means for selecting one of said logic circuits to be measured for inclusion in each of said second and third loops.

6. The measuring system of claim 1 wherein:
   the differences in time duration between said reference signal and said second and third periodic signals are determined by the turn-on and turn-off delays, respectively, of said logic circuit.

7. The measuring system of claim 4 wherein:
   said second and third loops are identical to said first loop except that
     said second loop includes the turn-on delay of said logic circuit, and
     said third loop includes the turn-off delay of said logic circuit,
   said differences in time duration therefore being equal to the turn-on and turn-off delays, respectively, of said logic circuit.

8. For use on an LSI chip, a system for measuring the turn-on and turn-off delays of a loaded logic circuit on said chip, said system comprising:
   a first loop not including said logic circuit for producing a first periodic reference signal;
   a second loop including said logic circuit for producing a second periodic signal, said second periodic signal being related to said reference signal in a manner that is dependent upon the turn-on or turn-off delay of said logic circuit;
   a third loop including said logic circuit and producing a third periodic signal, said third periodic signal being related to said reference signal in a manner that is dependent upon the sum of the turn-on and turn-off delays of said logic circuit; and
   means for causing mutually exclusive production by said loops of each of said periodic signals.

9. The measuring system of claim 8 wherein:
   the differences in time duration between said reference signal and said second and third periodic signals are determined by the turn-on or turn-off delays and by the sum of the turn-on and turn-off delays, respectively, of said logic circuit.

* * * * *